United States Patent [19]

Finger

[11] Patent Number: 5,202,682
[45] Date of Patent: Apr. 13, 1993

[54] DATA ENCODEMENT AND READING METHOD AND APPARATUS

[75] Inventor: Eugene P. Finger, Brewster, N.Y.

[73] Assignee: Curtis Instruments, Inc., Mt. Kisco, N.Y.

[21] Appl. No.: 780,409

[22] Filed: Oct. 18, 1991

Related U.S. Application Data

[63] Continuation-in-part of Ser. No. 377,571, Jul. 13, 1989, abandoned.

[51] Int. Cl.[5] ............................................. G08C 19/16
[52] U.S. Cl. .......................... 340/870.19; 340/870.09; 340/870.24; 341/182; 324/76 R
[58] Field of Search ............... 340/870.04, 870.09, 340/870.19, 870.24, 870.25, 870.27, 825.63, 825.57; 341/178, 180, 182; 370/41; 375/22, 23, 24; 377/16, 20, 25; 324/77 R, 99 D, 118

[56] References Cited

U.S. PATENT DOCUMENTS

| | | | |
|---|---|---|---|
| 3,623,044 | 11/1971 | Wagner | 340/870.25 |
| 3,673,552 | 6/1972 | Mross et al. | 340/870.24 |
| 3,714,576 | 1/1973 | Kirby et al. | 340/870.27 |
| 4,107,667 | 8/1978 | Kronlage | 341/167 |
| 4,115,733 | 9/1978 | Silberberg | 324/990 |
| 4,591,810 | 5/1986 | Mackenzie et al. | 324/118 |
| 4,596,965 | 6/1986 | Schiek et al. | 340/870.25 |
| 4,712,195 | 12/1987 | Finger | 365/226 |
| 4,852,104 | 7/1989 | Finger | 377/16 |

OTHER PUBLICATIONS

Brochure on Fluke 80 Series multimeter, by John Fluke Mfg. Co., Inc., 1988-1989.

Primary Examiner—Donald J. Yusko
Assistant Examiner—Michael Horabik
Attorney, Agent, or Firm—John H. Crozier

[57] ABSTRACT

A method and apparatus for measuring operations data which uses a commercially available digital multimeter (DMM) as the data receiving and display device. In one preferred embodiment, for example, basic operations data is transduced to digital form and then coded with a width modulator. The width modulated data may represent, for example, total elapsed time or total counts of a measured operation. The full-scale range of the data is encoded as frequency. A technician reads the frequency of the data signal with the DMM to determine the full-scale range of the data and then reads percent-of-range with the DMM as duty cycle. For multiple operations data, peak voltage is used as a parameter identifier. Alternatively, the value of the parameter being measured, the full-scale range, and the parameter identifier may be encoded as any combination of frequency, peak voltage, or duty cycle. In a further aspect, one parameter, preferably frequency, may be encoded with additional information, such as data site and data channel. In another aspect, the data stream is amplitude modulated to indicate selected alarm levels.

28 Claims, 9 Drawing Sheets

DATA ENCODEMENT AND READING METHOD AND APPARATUS

This is a continuation-in-part of co-pending application Ser. No. 07/377,571 filed on Jul. 13, 1989, now abandoned.

BACKGROUND OF THE INVENTION

1. Field of the Invention.

The present invention relates generally to a method and apparatus for "reading" accumulated data in electronic form and, more particularly, to such method and apparatus which is simple, accurate, and is especially well suited for field measurements by relatively unskilled technicians employing a commercially available, hand-held digital multimeter.

2. Background Art.

There are many applications for data measurement which require reasonable accuracy, but which do not require the accuracy of most specialized data reading systems. One example of such an application is reading operating data measurements on a piece of machinery, such as, for example, a tractor having an internal combustion engine. Some data measurements of interest for that application could include total hours running time, total number of starts, total number of revolutions, and an integral function representing thermal stress or rotating stress over a period of time. The latter types of measurements, for example, may integrate a strain gage output with respect to time.

There are many known methods and apparatus for transducing such data to digital information for contemporaneous or subsequent transmission, storage, display, and/or processing. Such methods and apparatus, in many cases, require specialized components which are typically dedicated to a particular measurement or application, are expensive, and often require some degree of technical sophistication on the part of the user.

U.S. Pat. No. 4,712,195, issued Dec. 8, 1987, titled "Solid-State Cumulative Operations Measurement System", assigned to the assignee of the present invention, the disclosure of which patent is made a part hereof by reference, describes a measurement system which accumulates and stores accumulated operations data in terms of either total elapsed time or digital counts. Briefly, the measurement system includes a volatile memory register which receives and stores input voltage signals representing operations data and a nonvolatile memory into which the count stored in the volatile memory is transferred when the voltage signals terminate. When data flow resumes, the count stored in the nonvolatile memory is transferred to the volatile memory. Means are included to protect the solid state circuitry employed from noise or non-operation oscillations in the input voltages. The patent also describes a reader for use with the system which reader activates a serial encoder in the system through which encoder data in the memories is made available in a digitally coded data bit stream. The measurement system described provides 1 part in 10 million resolution (referred to full scale), and an accuracy on the order of several parts per million, depending on crystal oscillator accuracy, but requires a special reader or a specially programmed computer interface which could be difficult or impossible for a relatively unskilled technician to use in the case of isolated field measurements.

In copending U.S. patent application Ser. No. 07/071,801, filed Jul. 13, 1987, titled "Solid-State Reader Device For A Cumulative Operations Measurement System", and assigned to the assignee of the present invention, now U.S. Pat. No. 4,852,104, issued Jul. 25, 1989, the disclosure of which application is made a part hereof by reference, there is described a reader that is particularly well suited for use with the system of the above-referenced patent.

Another type of operations measurement device is described in U.S. Pat. No. 3,665,308, issued May 23, 1972, titled "Package For An Electrochemical Elapsed Time Meter", and assigned to the assignee of the present invention, wherein an analog mercury coulometer tube is employed as an elapsed time indicator. A DC current passing through a column of mercury in the tube causes the movement of mercury molecules through an electrolyte gap in the column, with the resulting change in position of the meniscus of the mercury being the integral of DC current level with respect to time.

Instruments based on the disclosures of the above patents and application are manufactured by Curtis Instruments, Inc, Mt. Kisco, N.Y.

Other types of prior cumulative operations measurement systems are well known electro-mechanical devices in which synchronous motors or pulse circuits are used to advance mechanical counters.

The above types of devices and systems bracket the extremes of resolution and accuracy associated with contemporary timers and integrators. The bit serial elapsed timer/digital readout of U.S. Pat. No. 4,712,195 and the bit serial reader of U.S. Pat. No. 4,852,104 are at the high end of resolution and accuracy. Typically, these would be dedicated components.

The analog mercury coulometer offers resolution and accuracy on the order of 1-2 parts per hundred, is relatively inexpensive, but is vulnerable to temperature changes and shock and vibration.

The electro-mechanical devices have slow response, limited resolution, and tend to be bulky and expensive.

In most cases where there is a requirement to read operations measurement data with any degree of accuracy, the specialized types of instruments noted above must be used. These are relatively sensitive instruments, in many cases not well suited for field measurements. Additionally, many of these instruments require a certain level of training and sophistication on the part of the user. What is needed, but heretofore has been unavailable, is a data encodement and reading system which can be used by a person relatively unskilled in the art of data measurement and which only requires relatively inexpensive, low resolution equipment of the type likely to be found in the tool box of most field service people. Such system should require only very simple interconnections and be usable by such relatively unskilled person following a data reading procedure which can be printed on a card or even on a label affixed to a piece of equipment, without the person needing any understanding of the workings of the system.

A further desirable goal of such a system is to be able to obtain very precise measurement data from such low resolution equipment.

Accordingly, it is a principal object of the present invention to provide a method and apparatus for reading operations measurement data which offer good resolution and are relatively accurate, yet are economical and easy to employ.

Another object of the invention is to provide such method and apparatus which are amenable to the taking of isolated field measurements by a relatively unskilled technician.

An additional object of the invention is to provide such method and apparatus which employ as a reading device a commercially available digital multi-meter.

A further object of the invention is to provide such method and apparatus which provides such operations measurement data in a form that the digital multi-meter can measure the same with precision far above its normal level of resolution.

Other objects of the invention, as well as particular advantages and features thereof, will be apparent from the following description and the accompanying drawing figures.

SUMMARY OF THE INVENTION

The present invention substantially overcomes the disadvantages of conventional operations measurement systems and achieves the above objects, among others, by providing a method and apparatus for measuring operations data which uses a commercially available digital multimeter (DMM) as the data receiving and display device. In one preferred embodiment, for example, basic operations data is transduced to digital form and then coded with a width modulator. The width modulated data may represent, for example, total elapsed time or total counts of a measured operation. The full-scale range of the data is encoded as frequency. A technician reads the frequency of the data signal with the DMM to determine the full-scale range of the data and then reads percent-of-range with the DMM as duty cycle. For multiple operations data, peak voltage is used as a parameter identifier. Alternatively, the value of the parameter being measured, the full-scale range, and the parameter identifier may be encoded as any combination of frequency, peak voltage, or duty cycle. In a further aspect of the invention, one parameter, preferably frequency, may be encoded with additional information, such as data site and data channel. In another aspect of the invention, the data stream is amplitude modulated to indicate selected alarm levels. In an additional aspect of the invention, a unique method of resetting data storage is provided.

DESCRIPTION OF THE PREFERRED EMBODIMENTS

Figure 1:
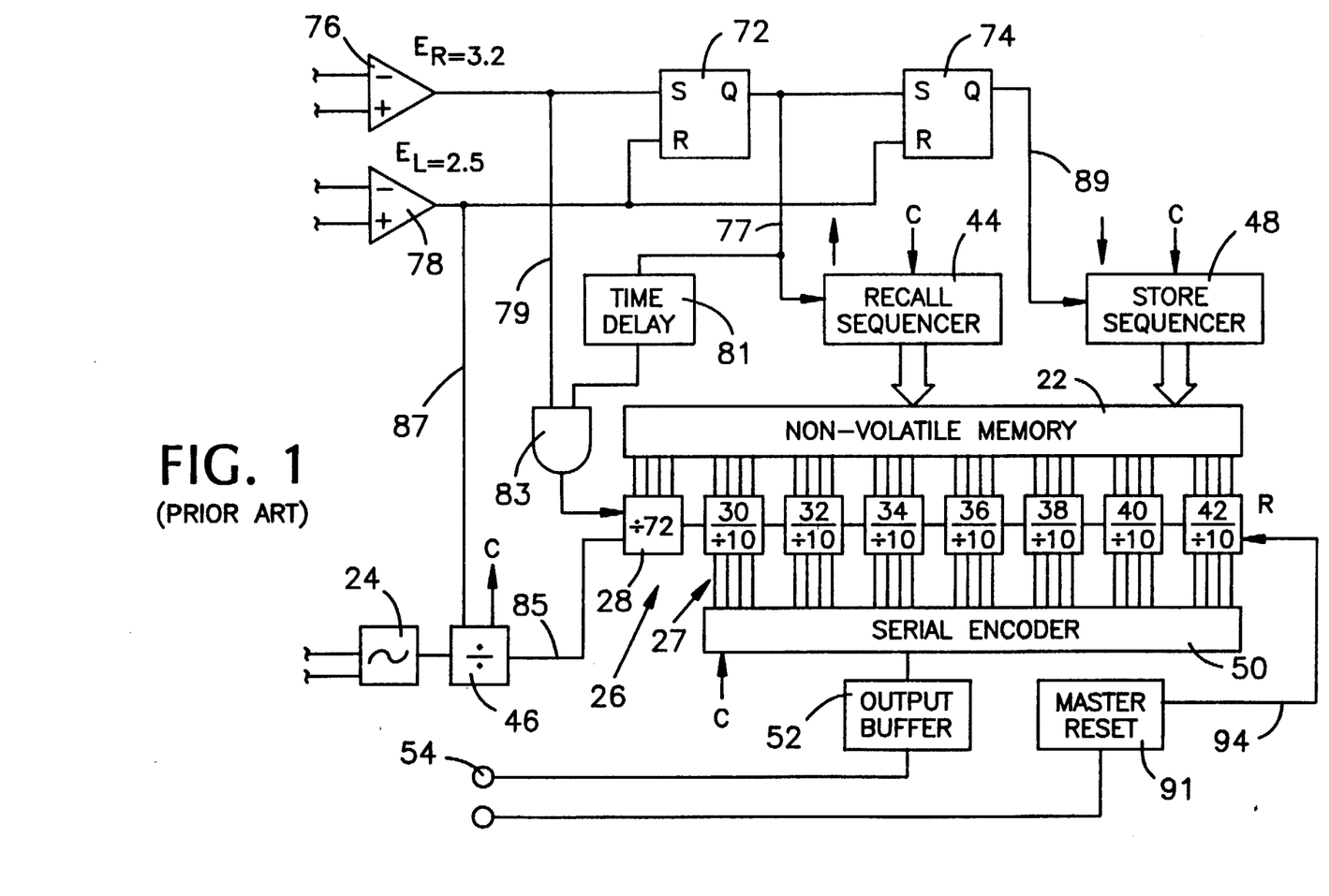
FIG. 1 is a partial schematic diagram of an embodiment of an operations measurement system disclosed in U.S. Pat. No. 4,712,195.

Referring now to the Drawing, FIG. 1 shows a portion of one embodiment of the cumulative operations measurement system disclosed in above-referenced U.S. Pat. No. 4,712,195 (hereinafter "the Patent"), that embodiment limited to the measurement of total operating time. The system includes a nonvolatile memory 22, a 32.768-KHz. oscillator 24, and a volatile counter memory register 26, the latter including a series of stages 28-42 operating as digital divider circuits; all interconnected as shown. The divider circuit 28 preferably divides by a factor of 72. Each of the dividers 30-42 preferably divides by a factor of 10. The dividers 30-42 comprise a decimal register 27. The outputs of voltage comparison amplifiers 76 and 78 operate to control latch circuits 72 and 74 and, upon startup of the operation being measured, a recall sequencer 44 is activated to recall a count number previously stored in nonvolatile memory 22 and transfer it to volatile memory register 26 before commencement of the time measurement. Time is measured by means of timed pulses delivered from oscillator 24 to volatile memory register 26 through a divider circuit 46. When voltage is removed from the operations measurement system, store sequencer circuit 48 is activated to store in nonvolatile memory 22 the count number in volatile memory register 26. Volatile memory register is reset through a signal to a master reset 91.

When it is desired to read data in the system of the Patent, a serial encoder 50 provides a stream of serial bit data through an output buffer 52 to output terminal 54. If the system is not active at the time of reading, the reader furnishes sufficient power to the system to activate recall sequencer 44 and transfer the data from nonvolatile memory 22 to volatile memory register 26 so that it may be read.

Another embodiment of the system of the Patent may be employed to collect either total elapsed time or total count data. For a more detailed understanding of the system of the Patent, reference should be made to the Patent itself.

It will be understood that, while the embodiments described in the Patent are entirely satisfactory for use in situations requiring a high degree of resolution and accuracy, they can be difficult to use by a relatively unskilled technician making isolated field measurements and in other situations in which it would be desirable to read stored data with reasonable resolution and accuracy and to be able to do so easily and without the use of specialized instruments.

Figure 2:
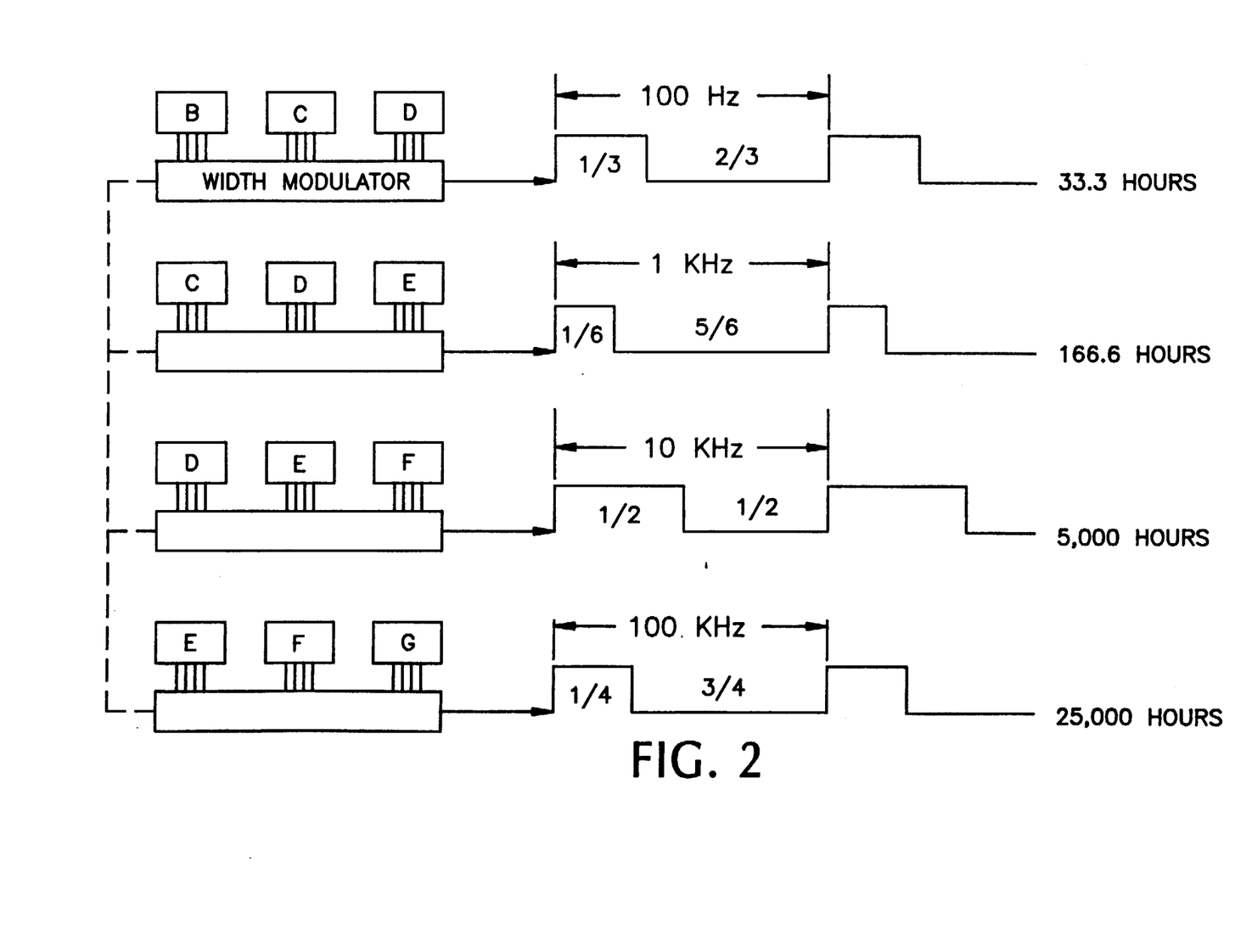
FIG. 2 is a block diagram showing the basic operation of the present invention.

Reference now to FIG. 2 will indicated how the data collected and stored in the system of the Patent can be configured so that it may be read by a conventional digital multimeter (DMM). Assume that the data under consideration is a measurement of total operating time and that circuits indicated by B-G on FIG. 2 are digital divide-by-ten circuits in a volatile memory register such as volatile memory register 26 of FIG. 1. Here, rather than outputing data through a serial bit encoder, the data is outputed through a pulse width modulator and the frequency of the modulator is set to indicate which of the divider circuits are involved in the encodement, in this case which groups of three are involved, although groups of any number could be involved. For the example shown, circuit B represents tenths, circuit C represents ones, and so forth, up to circuit G which represents ten thousands.

The above arrangement facilitates the readout of data by a DMM. For example, in the top data waveform on FIG. 2, the frequency of the output is 100 Hz., thus indicating, in this case, that the full scale reading is 100 hours. The output waveform is pulse width modulated so that the waveform is positive for one-third of a cycle. Now, the person taking the data measurement has only to first use the DMM to measure frequency, observe that the measurement is 100 Hz. (i.e., full scale is 100 hours), then use the DMM function to measure duty cycle and read 33.3% (i.e.. 33.3 hours elapsed time). Likewise, if the total elapsed time accumulates to over 10,000 hours (bottom line of FIG. 2), the frequency reading would be 100 KHz. and (for the example shown) the duty cycle reading is 25.00%, or 25,000 hours total elapsed time. It will be understood that the above ranges have been given for example only and that 1 Hz. does not necessarily have to represent 1 hour.

Figure 8:
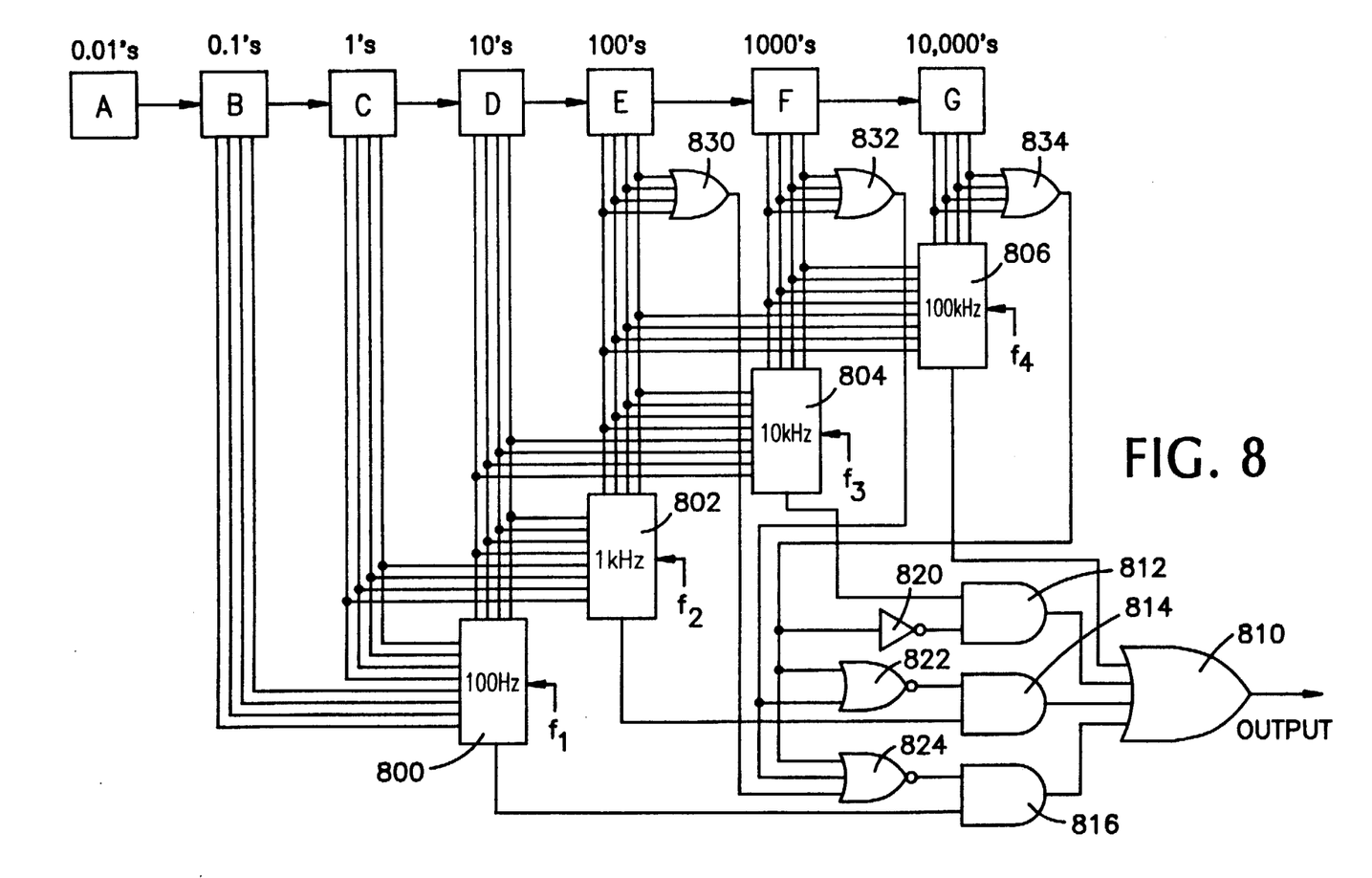
FIG. 8 is a block diagram elaborating on FIG. 2.

FIG. 8 illustrates in more detail the operation of the elements shown on FIG. 2. Digital divide-by-ten circuits A-G are coupled to binary coded digits-to-pulse width modulators 800, 802, 804, and 806 having frequency inputs which establish the modulation frequencies shown on FIG. 8. Circuit B is connected to provide an input to modulator 800; circuit C is connected to provide inputs to modulators 800 and 802; circuit D is connected to provide inputs to modulators 800, 802, and 804; circuit E is connected to provide inputs to modulators 802, 804, and 806; circuit F is connected to provide inputs to modulators 804 and 806; and circuit G is connected to provide an input to modulator 806. An output OR gate 810 receives inputs from modulator 806, and AND gates 812, 814, and 816. AND gate 812 is connected to receive inputs from modulator 804 and NAND gate 820, AND gate 814 is connected to receive inputs from modulator 802 and NOR gate 822, and AND gate 816 is connected to receive inputs from modulator 800 and NAND gate 824. OR gates 830, 832, and 834 are connected to receive inputs from circuits E, F, and G, respectfully. OR gates 830, 832, and 834 provide inputs to NOR gate 824, OR gates 832 and 834 provide inputs to NOR gate 822, and OR gate 834 provides an input to NAND gate 820.

In operation, when the register comprising circuits A-G contain 33.3 hours, modulator 800 provides an output through AND gate 816 and OR gate 810. When the register contains 166.6 hours, OR gates 830, 832, and 834 will block modulator 800 via NOR gate 824 and AND gate 816, while modulator 802 provides an output through AND gate 814 and OR gate 810. When the register contains 5,000 hours, OR gates 832 and 834 block modulator 802 via NOR gate 822 and AND gate 814, while modulator 804 provides an output through AND gate 812 and OR gate 810. Finally, when the register contains 25,000 hours, OR gates 830, 832, and 834 block modulators 800, 802, and 804, while modulator 806 provides an output directly through OR gate 810.

An alternative to the scheme shown on FIG. 8 is to employ a single modulator, with the inputs and frequencies being switched. When employed in a microprocessor, software instructions based on "equal-to-or-greater-than" number searches of the register would instruct the modulator with respect to percentage and frequency.

The foregoing scheme has the effect of greatly increasing the precision with which a DMM, a relatively low resolution instrument, can read data. The practical accuracy of such an instrument is typically on the order of about one part in 500. In the example given, the accuracy is effectively increased by three orders of magnitude. If the full scale range of elapsed time data were limited to 25,000 hours, the accuracy of reading would be about plus or minus 50 hours, which means that short intervals of elapsed time could not be measured. However, through the example encoding of the data as described above, short intervals can be read with a full scale range of 33.3 hours, with an accuracy of plus or minus 0.7 hour. Thus, the emphasis of the invention is on the generation and encoding of the data so that the same may be read with a relatively high degree of accuracy by a relatively inexpensive, relatively low resolution instrument on a single pair of lines. Most data reading systems emphasize only the reading equipment and attempt to provide such equipment that is highly precise in itself without regard to the data source.

A DMM useful in practicing the present invention may be one of the Fluke 80 series multimeters and is preferably the Fluke 87 multimeter, as furnished by John Fluke Manufacturing Company, Inc., Everett, Wash. The Fluke 87 multimeter has 0.1% DC accuracy, a 4½-digit readout, and measures frequency and average and peak voltages, among other features. A duty cycle function provides a percentage readout from pulse width modulated inputs. Average voltage reading can be substituted for duty cycle if the level of peak voltage is taken into account, and, for purposes of this disclosure and the claims appended hereto, such substitution is considered the equivalent of duty cycle.

A particular advantage of using such a meter as the data receiving and display instrument is that the meter is likely to be a standard item in the technician's tool box and no specialized instrument is required. The meter is designed to be compact and rugged for use in the field, as opposed to more sensitive, laboratory-type instruments. The meter is also economical to purchase and simple to use. All that is required is for the technician to attach two leads to output connections on the piece of equipment to be analyzed. The simple sequential procedure for taking the measurements may be included in the service manual and/or it may simply be printed on a label near the output connections on the equipment. No specialized knowledge is required, as the technician is reading data measurements with which he is familiar from other uses of the meter.

With the decade arrangement shown on FIG. 2, the system starts, for example, with a 100-hour range and when 100 hours is exceed, the range automatically switches to 1000 hours. Then when 1000 hours is exceeded, the range automatically switches to 10,000 hours. For example, when the total time is 99 hours, the reading will be 99% in the 100-hour range and when the total time goes to 101 hours, the reading will be 10.1% in the 1000-hour range. Thus, when the total time is more than 9 hours, there will always be two digits before the decimal point. This arrangement assures that the nominal 0.1% accuracy of the DMM does not become critical to the measurement.

Figure 3:
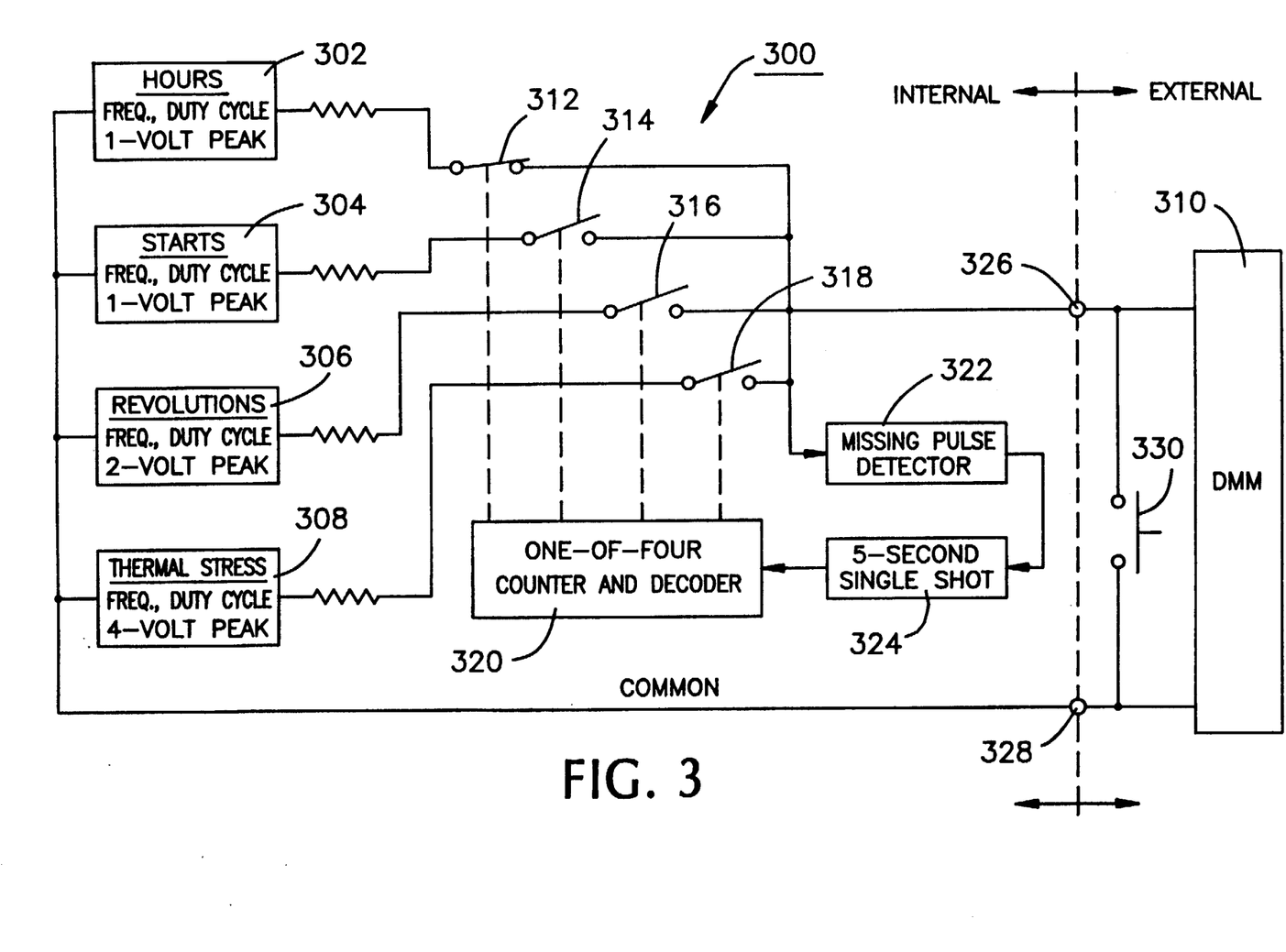
FIG. 3 is a block diagram showing one embodiment of the present invention using a digital multimeter to read data.

To further expand the usefulness of the DMM in situations in which several channels of data may be transmitted over the same transmission line or through the same output connections on a machine, it is desirable to involve three variables: frequency, duty cycle, and amplitude (peak voltage). FIG. 3 shows an embodiment of the present invention comprising a data reading system, generally indicated by the reference numeral 300, which may be used to read such several channels of data, here, for purposes of example only, total elapsed time, number of starts, total revolutions, and thermal stress. Such parameters might be of interest in monitoring performance of a tractor having an internal combustion engine.

System 300 includes data transmitters 302, 304, 306, and 308 which may be assumed to include, for example, cumulative operations measurement systems according to the teachings of above-referenced U.S. Pat. No. 4,712,195, with output data encoded with pulse width modulators according to FIG. 2 hereof. Data transmitters 302, 304, 306, and 308 of system 300 are connected to provide an input signal to DMM 310 through, respectively, switches 312, 314, 316, and 318, the switches operable by a one-of-four counter and decoder 320, such that only one of the four switches is connected to provide an input to the DMM at any one time. The input to DMM 310 is also an input to a missing pulse detector 322 which initiates a 5-second (arbitrary interval) single-shot circuit 324 which, in turn, causes one-of-four counter and decoder 320 to increment. System 300 may be internal to the machine being tested, as indicated on FIG. 3 and may be accessible to external measurement through connections 326 and 328 which may be jacks for leads from DMM 310. Disposed across the inputs to DMM 310 is a momentary contact switch 330 which shorts the inputs.

In the embodiment of FIG. 3, the three variables of frequency, duty cycle, and amplitude encode the data as follows: frequency and duty cycle represent full scale and percent of full scale, respectively, as described with reference to FIG. 2, and peak voltage serves as an identifier to indicate which parameter is being read. For example, in operation, the technician connects DMM 310 to connections 326 and 328, sets the DMM to read peak voltage, then depresses switch 330 for a given minimum period of time. Missing pulse detector 322 then senses the absence of a signal which activates 5-second single-shot circuit 324 to cause counter 320 to increment and close the next switch, in this case switch 312. DMM 310 will read 1 volt, thus indicating that the parameter being read is total elapsed time. The technician then sets the DMM 310 to read frequency to read the full-scale range, and then sets the DMM to read duty cycle to read percent of full-scale. The technician then again presses switch 330, again shorting the input to DMM 310 and the cycle is repeated for the next parameter, in this case the total number of starts. Other parameters will be sequentially read in a like manner. It will be understood that the reading sequence may not necessarily start with the closing of switch 312, but whatever switch is closed first, the parameter being read will be immediately identifiable by the technician by reading the peak voltage and referring to a chart in the service manual or on a label near output connections 326 and 328.

It will be understood that switch 330 must be depressed some minimum amount of time. For example, if the lowest transmission frequency is, say, 10 Hz., switch 330 would have to be depressed a minimum of 0.1 second to guarantee "killing" at least one transmission cycle. Alternatively, a small, fixed offset could be applied which when shorted would produce an instant response.

The external momentary contact switch, although convenient, is not mandatory, as the technician can simply short the data input by taking the jack from the voltage input and inserting it into the current input for the required time, since the current input is shunted to the common input, and then reinserting the jack into the voltage input to read the function identifier. This latter procedure is especially useful with the above-identified DMM, since the shorting of the inputs is accompanied by an audible signal.

It will be understood that the frequency, duty cycle, and peak voltage can be reassigned in any desired manner within the intent of the present invention. For example, duty cycle could be assigned as a range identifier; so, for example, a reading of 10% could indicate a maximum range of 100 hours, 20% a maximum range of 1000 hours, and so forth. Then, for example, frequency could be assigned to indicate the value of the parameter, such as each 10-Hz. increment equaling 1 hour.

Figure 4:
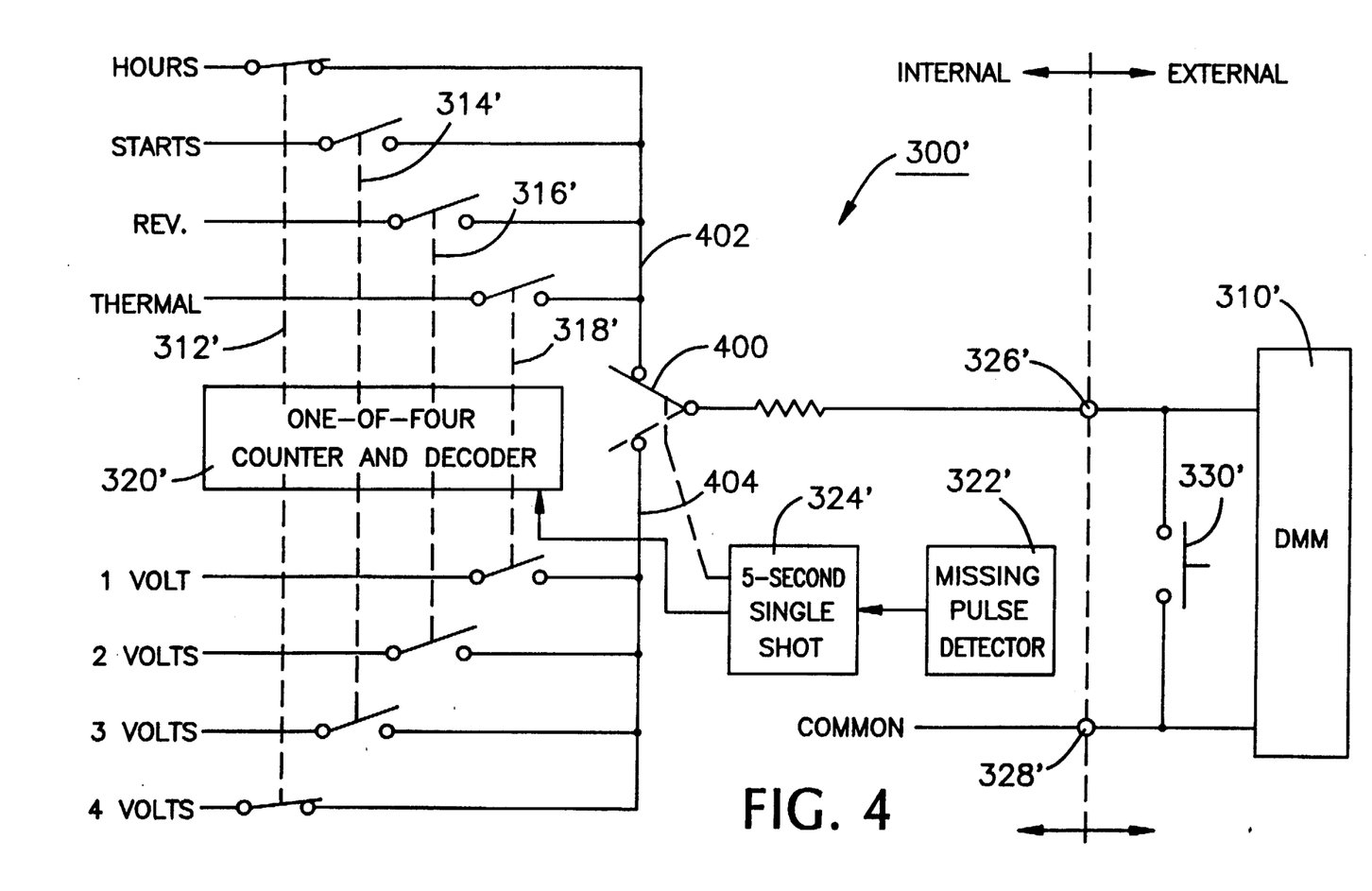
FIG. 4 is a block diagram showing another embodiment of the present invention using a digital multimeter to read data.

FIG. 4 shows a modification of system 300 of FIG. 3, here the identifying numerals for components similar to those shown on FIG. 3 are given primed reference numerals. System 300' is especially useful where the output from any channel produces a valid output pulse width which is too narrow for reliable peak reading. This limitation is overcome with system 300' by means of providing compound switches 312; 314; 316; and 318' which provide an initial sustained voltage identifier which can be easily read in one of the voltage reading modes. In operation, switch 330' is closed for, say, 0.25 to 2 seconds, activating missing pulse detector 322' which immediately increments the one-of-four counter and decoder 320' and also switches a switch 400 from a data output line 402 (solid position of switch 400) to a voltage identifier line 404 (dashed position of switch 400). As soon as switch 330' is released, 4 volts will appear on the readout of DMM 310' and will remain there until the end of the 5-second interval when switch 400 is switched to data output line 402 (solid position of switch 400). If the time after the opening of switch 330' is to be constant, system 300' can be further enhanced by including an auxiliary "off delay" (not shown) to sustain the identifier for a precise interval of time, e.g. three seconds.

Again, the invention is not limited to the arrangement of the parameters described with respect to the embodiments of FIGS. 3 and 4, but may be any desired arrangement of the parameters. Also, it is not necessary that the variables be read in any particular order; although, some orders of reading may be more convenient than others.

A potential problem with the present invention as described above may exist when a new system is being put on line and there is no data in memory. This problem can be overcome by introducing into the data chain a short spike which will guarantee that there will be a rising voltage edge. For example, assume that the first data transmission will occur at 10 Hz. With the 0.1% accuracy of the DMM, the smallest value that could be read would be 100 microseconds. Therefore, one can introduce, say, a 1 microsecond false pulse which the DMM will still read as zero, since that value is only 1% of the smallest that can be read, but the DMM will be able to pick up a frequency. Alternatively, the memory counter could be pre-loaded with a fixed value and the technician instructed to subtract that value from the first reading.

While, as noted above, any arrangement of parameters may be employed with the present invention, certain parameters are better suited than others for certain purposes. For example, frequency can be read with a DMM with great resolution and, therefore, as further described below, a large amount of information may be encoded in a frequency signal. Voltage, on the other hand, being produced and read in an analog mode, would not normally be used where high resolution is required and is well suited to use as an identifier as in the embodiment shown on FIG. 4 or in other cases where fairly large increments are satisfactory.

Figure 5:
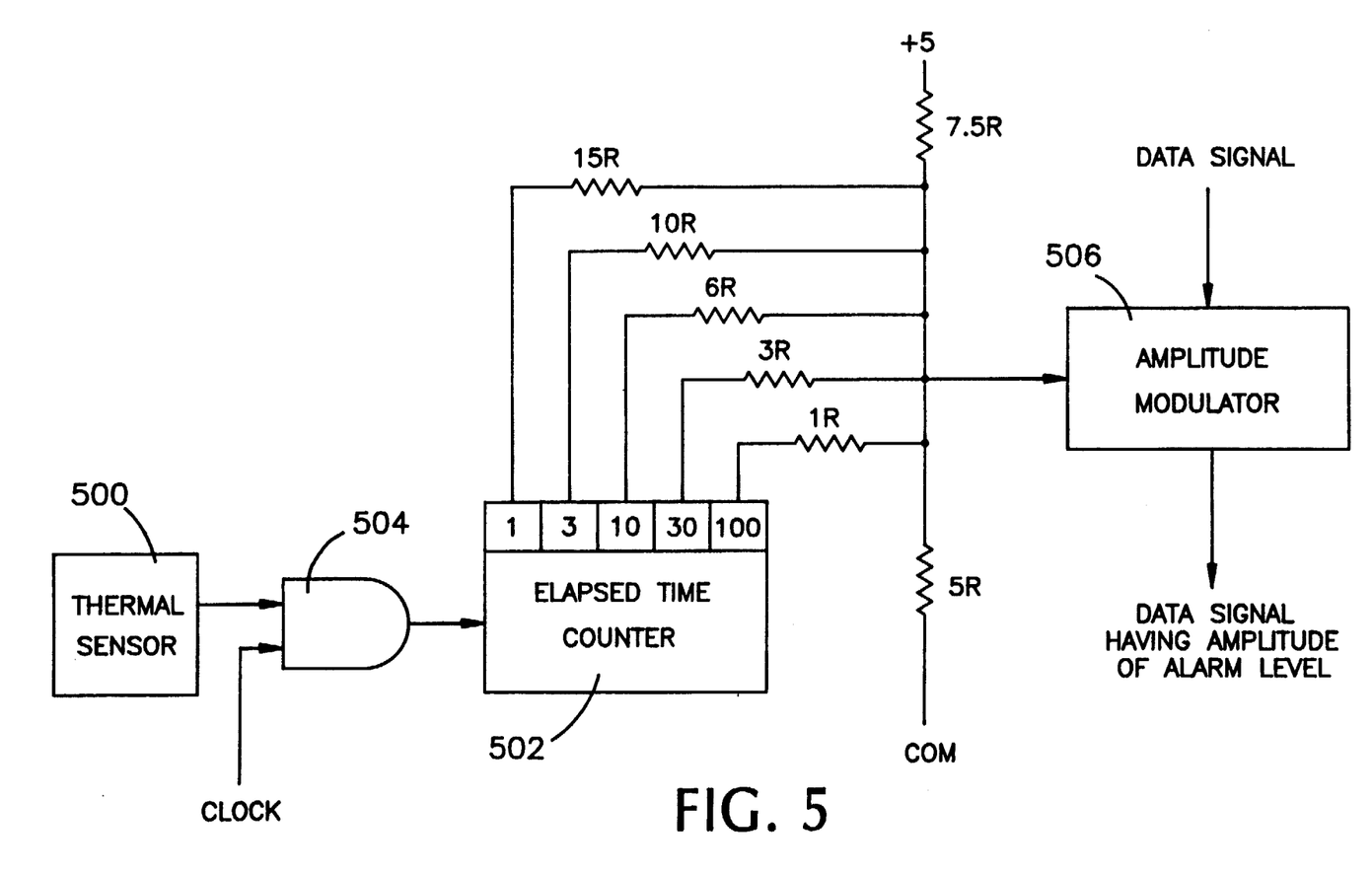
FIG. 5 is a block diagram showing an embodiment of the present invention in which data is encoded with an alarm level by means of selectively varying the amplitude of the data signal.

An example of another use to which voltage measurement may be advantageously employed is illustrated on FIG. 5, where the amplitude of the data signal is modulated to serve as an alarm signal, here, for illustrative purposes only, as an indicator of the total time a piece of equipment has been in an overtemperature condition. This is a situation where, typically, great accuracy in knowing the precise total time is not required, but it is desirable to have an indication of a fairly broad interval of time the equipment has been in an overtemperature condition. Referring to FIG. 5, a signal from an overtemperature sensor 500 is gated to an elapsed time counter 502 through an AND gate 504 by a clock signal. The outputs from elapsed time counter 502 have been arbitrarily set for ranges of up to 1 hour, 1 to 3 hours, 3 to 10 hours, 10 to 30 hours, and 30 to 100 hours. With the values of the resistors indicated, the voltage from counter 502 will be 2 volts when there is no signal from the counter, 2.5 volts when up to 1 hour, 3.0 volts when 1 to 3 hours, 3.5 volts when 3 to 10 hours, 4.0 volts when 10 to 30 hours, and 4.5 volts when 30 to 100 hours. Thus, the voltage intervals are large steps and well within the resolution of a DMM. The voltage signal from counter 502 is an input to amplitude modulator 506 which transmits the data signal at the amplitude determined by the voltage level from the counter. When applied to the embodiment of FIG. 4, for example, amplitude modulator 506 would be placed in data output line 402. It will be understood that the resulting "alarm" signal is not merely indicating an excursion out of range of a normal data stream, but is indicating an alarm condition of something other than the data that is being read.

It will be noted that no provision has been made in the embodiments of FIGS. 3 and 4 to provide for resetting memories of the measurement system or supplying power to the measurement system when it is not operating, both of which functions are included in the readers of U.S. Pat. No. 4,712,195 and U.S. Pat. No. 4,852,104. While these functions may be provided for in conjunction with the present invention, they have not been shown with those embodiments, since, in the applications for which the invention is primarily expected to be used, the technician would not normally be resetting the memories and the power to the machine or other apparatus would normally be on.

When reset is desired, however, convenient shorting of the inputs to a DMM offers an easily employed scheme for resetting one or more data channels and one which may be coded to prevent unintentional or unpermitted resetting. In its basic aspect, the inputs of the DMM are shorted for a specified time. At the end of that time, if data signals resume, the reset circuit recognizes that a deliberate reset signal was sent and a data channel or all data channels are reset. It is desirable that a sufficiently long shorting time be required so that routine use of the instrument in data reading would not accidentally cause resetting. For example, a short-circuit interval of 27 seconds might be chosen, which is probably an order of magnitude longer than the inputs to the DMM would be shorted during normal data reading. Then, if data signals resume within a short period of time, say, 1 second, the reset circuit would recognize a reset signal was being transmitted and the data channel(s) would be reset.

The table below indicates an exemplary scheme with which a selected one of four data channels or all data channels can be reset using coded signals comprising selected series of timed short- and open-circuits:

| ACCESS CODE (SECONDS) | | | |
|---|---|---|---|
| Short | Open | Short | FUNCTION |
| 12 | 3 | 17 | Reset all channels |
| 9 | 6 | 8 | Reset channel 1 |
| 10 | 4 | 5 | Reset channel 2 |
| 7 | 7 | 11 | Reset channel 3 |
| 5 | 9 | 7 | Reset channel 4 |

For example, when the reset circuit detects a short-circuit of 12 seconds followed by 3 seconds of open-circuit, and then 17 seconds of short-circuit followed by an open-circuit condition, it will reset all channels. It will be understood that the short-circuit inputs may be caused by shorting the inputs to a DMM, as described above with reference to FIGS. 3 and 4, but the present invention is not necessarily so limited.

Figure 6:
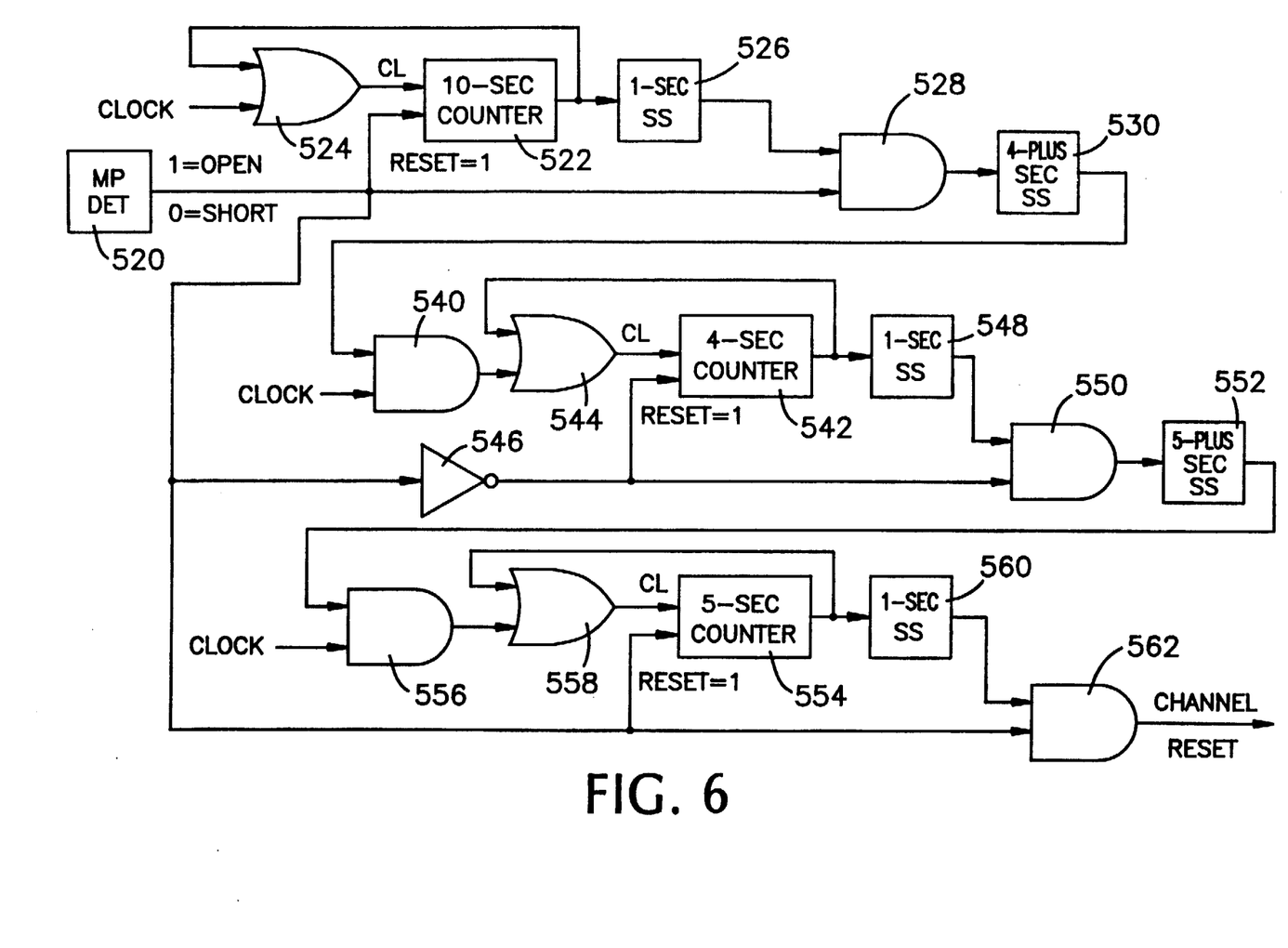
FIG. 6 is a block diagram showing an embodiment of the present invention which may be employed to reset a data source.

FIG. 6 illustrates the configuration of a reset circuit for resetting channel 2 according to the 10-short/4-open/5-short scheme set forth in the above table. There is included a device for selectively providing logical "1" or logical "0" signals, which may be, for example only, a missing pulse detector 520 connected to the data reading systems of FIGS. 3 or 4. Missing pulse detector 520 detects a missing pulse and provides a logical "0" output to 10-second counter 522 which allows the counter to count clock pulses provided through OR gate 524. If pulses resume during the 10-second interval, missing pulse detector 520 will provide a logical "1" output to counter 522 which will reset the counter. If, however, the short-circuit continues for at least 10 seconds, counter 522 fires a 1-second single-shot circuit 526 and stops counting via the "lock-up" feedback to OR gate 524, the single-shot providing a logical "1" to AND gate 528. If during the 1-second interval, missing pulse detector 520 detects an open-circuit condition and provides a logical "1" output to AND gate 528, the AND gate will fire 4-plus-second single-shot 530. If, however, there is no open-circuit condition during the 1-second interval, 4-plus-second single-shot 530 will not be fired.

Assuming that the reset sequence is proceeding as set forth in the above table, 4-plus-second single-shot 530 provides a logical "1" input to AND gate 540 which provides a clock signal to 4-second counter 542 through OR gate 544. At this point, missing pulse detector 520 has detected an open condition and provides a logical "1" output, inverter 546 thereby providing a logical "0" to the reset input of counter 542, allowing the counter to count. At the end of the 4-second interval, 4-second counter 542 fires 1-second single-shot 548 which provides a logical "1" output to AND gate 550. If, now, a short-circuit condition is detected by missing pulse detector 520, a logical "1" will be produced at the output of inverter 546 and a 5-plus-second single-shot 552 will be fired by AND gate 550.

In like manner as the first two loops, 5-plus-second single-shot 552 causes a clock signal to be provided to 5-second counter 554 through AND gate 556 and OR gate 558, with 1-second single shot 560 providing a logical "1" input to AND gate 562. Providing that the reset sequence has proceeded properly, AND gate 562 will now receive a logical "1" input from missing pulse detector 520 and will provide an output reset signal, which signal may be provided, for example, to master reset 91 of FIG. 1.

It will be understood that, for example, 4-plus-second single-shot 530 must introduce a delay which is sufficiently longer than 4-second counter 542 to allow for clock digitization, less-than-perfect timing on the part of the technician, and the like.

As noted above, parameters, such as frequency, which can be read with high resolution may be employed to encode a great deal of information. For example, frequency may be used to encode a site, a data channel, and a range. This can be accomplished, for illustrative purposes only, by letting the tens digit represent a site, the units digit represent a channel, and the tenths digit represent a range. With this scheme, a reading of 32.4 KHz would identify the data as originating at site 3, channel 2, and the range is whatever has been assigned as range 4.

Figure 7A:
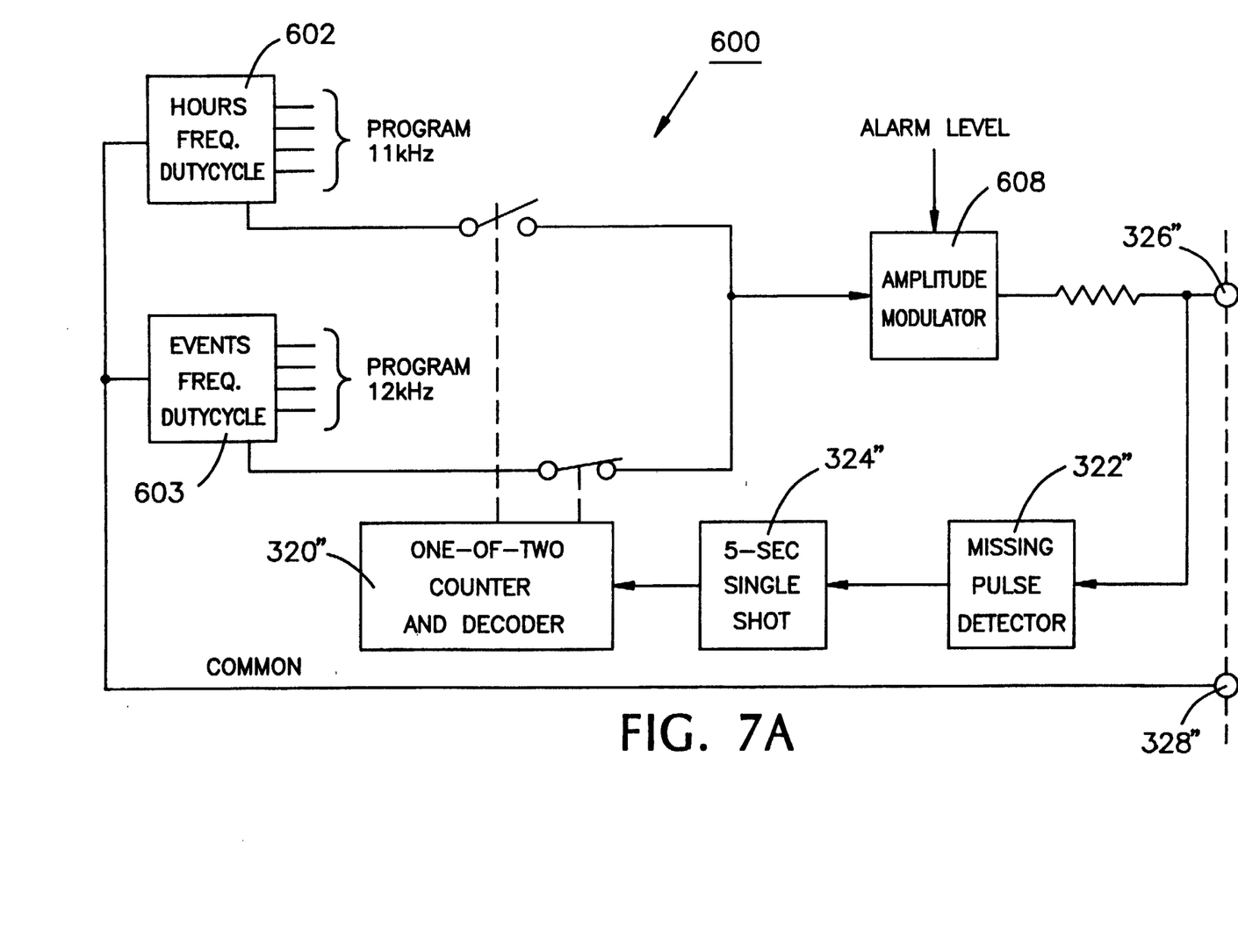
FIGS. 7A and 7B are block diagrams illustrating a further embodiment of the present invention.
Figure 7B:
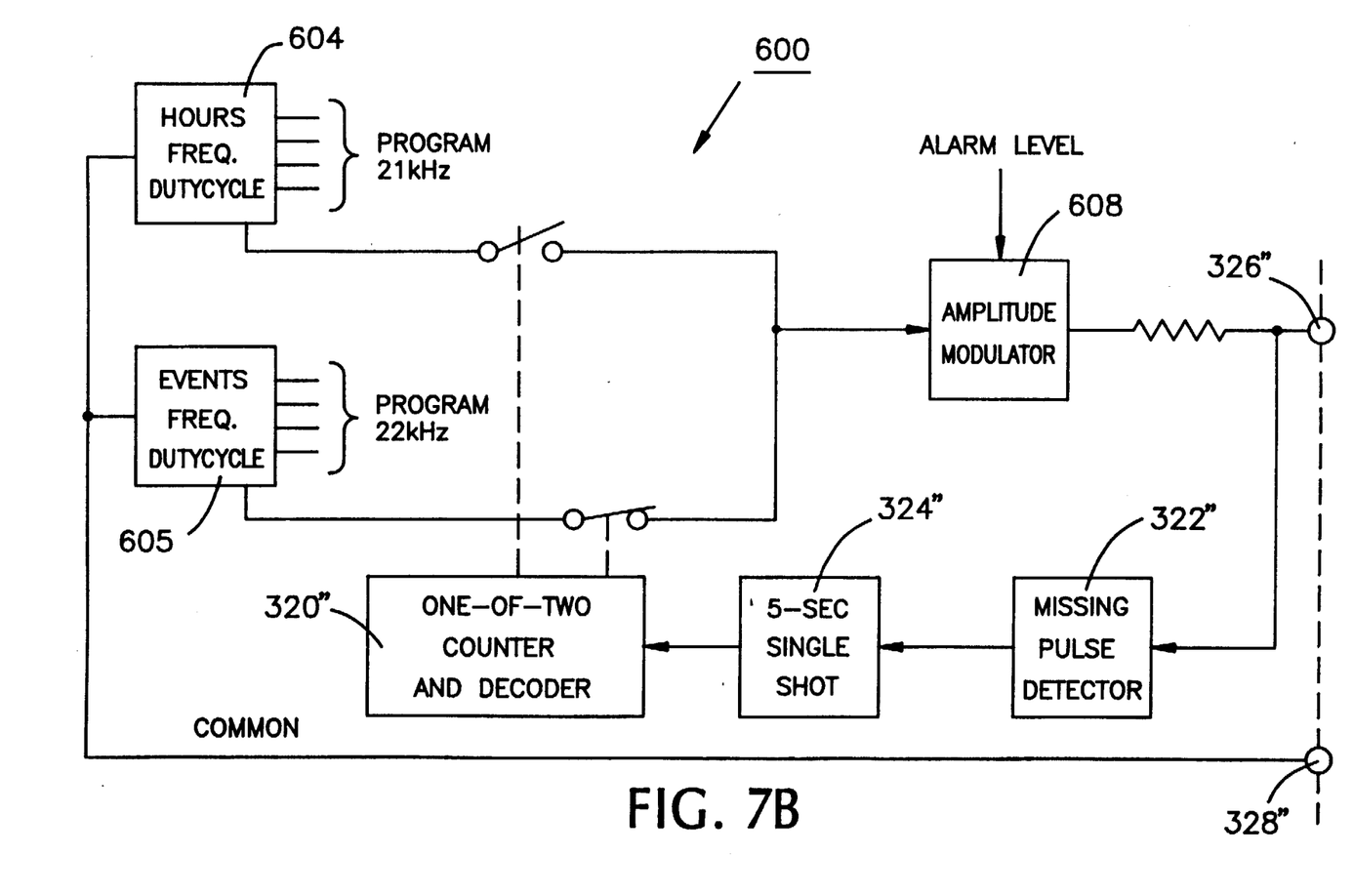

FIGS. 7A and 7B illustrate another embodiment of the present invention in which one variable, for example in this case, frequency, is encoded with multiple information and the data is read with a data reading system 600 which includes data terminals 602–605, one-of-two counter and decoder 320'', missing pulse detector 322'', 5-second single-shot 324'', and DMM connections 326'' and 328'' (DMM not shown), all having the same functions as described for similar elements on FIGS. 3 and 4. Also included is amplitude modulator 608 which has the same function as amplitude modulator 506 on FIG. 5. Here, FIG. 7A represents the situation where data transmitters 602 and 603 are at site "1" and FIG. 7B the situation where data transmitters 604 and 605 are at site "2".

Referring to FIG. 7A, data transmitter 602, which contains data representing elapsed time, for example, has been programmed so that the output thereof has a baseline frequency of 11 KHz, with the tens digit representing site "1" and the units digit representing channel "1". The range of the hours data is determined by the tenths digit, which may be raised by 100 Hz for each uprange. Likewise, on FIG. 7B, data transmitter 605, which represents total number of events, is programmed with a baseline frequency of 22 KHz, indicating that the data therefrom originates from site "2" and channel "2". In either case, percent of range would be read as duty cycle. Thus, even when data is received by a technician from multiple data sites and multiple channels at each site, the source of the data is uniquely identified. It will be understood that many orders of magnitude of unique combinations are available, each one being uniquely identified and easily readable by a DMM.

All functions of the systems of the present invention can be handled by a dedicated apparatus, but, most conveniently, the functions may be handled by a programmable microprocessor already part of the machine being analyzed and which microprocessor has other, primary purposes.

It will be understood that, while the present invention has been described as being particularly applicable to the reading of data in the field, it may be used as well in other settings and may be used in situations in which the readings are not taken directly from the machine being analyzed, but may be taken from data transmitted over a distance by any of various means known in the art.

It will thus be seen that the objects set forth above, among those made apparent from the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A method of processing and reading a single data signal having a value and representing a parameter, comprising:
   (a) electronically encoding said single data signal with a first variable indicating full-scale range of said value;
   (b) electronically encoding said single data signal with a second variable indicating the magnitude of said value;
   (c) reading said first variable in said single data signal to determine said full-scale range; and
   (d) reading said second variable in said single data signal to determine said value.

2. A method, as defined in claim 1, further including the steps of:
   (e) electronically encoding said single data signal with a third variable indicating said parameter said data represents; and
   (f) reading said third variable in said single data signal to determine said parameter said data represents.

3. A method, as defined in claim 1, wherein said first and second variables are selected from the group consisting of frequency, peak voltage, and duty cycle.

4. A method, as defined in claim 2, wherein said variables are two or more variables selected from the group consisting of frequency, peak voltage, and duty cycle.

5. A method, as defined in claim 1, wherein said variables are read with a digital multimeter.

6. A method, as defined in claim 3, further comprising means to encode said single data signal with a variable indicating an alarm level.

7. An apparatus for processing and reading a single data signal having a value and representing a parameter, comprising:
   (a) means for electronically encoding said single data signal with a first variable indicating full-scale range of said value;
   (b) means for electronically encoding said single data signal with a second variable indicating the magnitude of said value;
   (c) means for reading said first variable in said single data signal to determine said full-scale range; and

13

(d) means for reading said second variable in said single data signal to determine said value of said data.

8. An apparatus, as defined in claim 7, further comprising:
(e) means for electronically encoding said single data signal with a third variable indicating said parameter said data represents; and
(f) means for reading said third variable in said single data signal to determine said parameter said data represents.

9. An apparatus, as defined in claim 7, wherein said first and second variables are selected from the group consisting of frequency, peak voltage, and duty cycle.

10. An apparatus, as defined in claim 8, wherein said variables are two or more variables selected from the group consisting of frequency, peak voltage, and duty cycle.

11. An apparatus, as defined in claim 7, wherein said means for reading comprises a digital multimeter.

12. An apparatus, as defined in claim 10, further comprising:
(a) means for electronically encoding said single data signal with a variable selected from said group indicating an alarm condition; and
(b) means for reading said variable in said single data signal to determine if said alarm condition exists.

13. An apparatus for processing and reading single data signals indicating values of a plurality of parameters, comprising:
(a) a plurality of encoding means each one for connection to one of a plurality of devices each one containing one of said single data signals indicating the value of one of said parameters, each of said encoding means to receive and encode one of said single data signals with a first variable uniquely indicating the full-scale range of said value, to encode said single data signal with a second variable uniquely indicating the parameter represented by said first variable, and to encode said single data signal with a third variable the magnitude of which indicates the magnitude of said value of said parameter;
(b) connection means to connect said apparatus to the inputs of a digital multimeter;
(c) means to short-circuit said connection means a selected length of time during which no signal can be detected across said connection means;
(d) counter and decoder means to sequentially select one of said encoding means to provide one of said single data signals to said connection means;
(e) missing pulse means to detect when said connection means is shorted; and
(f) single shot circuit means responsive to said missing pulse means to cause said counter and decoder means to increment when said connection means is short-circuited.

14. An apparatus, as defined in claim 13, wherein said variables are two or more variables selected from the group consisting of frequency, peak voltage, and duty cycle.

15. An apparatus, as defined in claim 14, further comprising means to encode said single data signal with a variable indicating an alarm level.

16. An apparatus, as defined in claim 13, further comprising:
(a) reset circuit means connected to at least one of said plurality of devices for resetting thereof, said circuit means having input means to selectively provide logical "1" or logical "0" inputs, a selected output from which reset circuit means causes said at least one of said plurality of devices to rest; and
(b) said input means to selectively provide either a logical "1" input or a logical "0" input for a first selected period of time, at the end of which said first selected period of time, said reset circuit means provides said selected output.

17. An apparatus, as defined in claim 16, wherein said reset circuit means provides said selected output only after termination of the other of said logical "1" or "0" inputs for a second selected period of time following said first selected period of time.

18. An apparatus for processing and reading single data signals indicating values of a plurality of parameters, comprising:
(a) a plurality of encoding means each one for connection to one of a plurality of devices each one containing one of said single data signals indicating the value of one of said parameters, each of said encoding means to encode each one of said single data signals with a first variable uniquely indicating the full-scale range of said value and to encode said single data signal with a second variable the magnitude of which said second variable indicates the magnitude of said value of said parameter;
(b) means to provide for each parameter an identifying third variable indicating the identity of said parameter;
(c) connection means to connect said apparatus to the inputs of a digital multimeter;
(d) means to short-circuit said connection means a selected length of time during which no signal can be detected across said connection means;
(e) counter and decoder means to sequentially select one of said encoding means to provide one of said single data signals to said connection means;
(f) switch means to selectively provide to said connection means either one of said single data signals or the said identifying variable unique to said one of said single data signals;
(g) missing pulse means to detect when said connection means is shorted; and
(h) single shot circuit means responsive to said missing pulse means to cause said counter and decoder means to increment when said connection means is shorted, to cause said switch means to provide to said connection means said identifying third variable unique to said one of said single data signals for a selected interval of time, then to cause said switch means to provide to said connection means said first variable indicating the full-scale range of said value.

19. An apparatus, as defined in claim 18, wherein said variables are two or more variables selected from the group consisting of frequency, peak voltage, and duty cycle.

20. An apparatus, as defined in claim 19, further comprising means to encode said single data signal with a variable indicating an alarm level.

21. An apparatus, as defined in claim 18, further comprising:
(a) reset circuit means connected to at least one of said plurality of devices for resetting thereof, said circuit means having input means to selectively provide logical "1" or logical "0" inputs, a selected output from which reset circuit means causes said at least one of said plurality of devices to reset; and (b) said input means to selectively provide either a logical "1" input or a logical "0" input for a first selected period of time, at the end of which said first selected period of time, said reset circuit means provides said selected output.

22. An apparatus, as defined in claim 21, wherein said reset circuit means provides said selected output only after termination of the other of said logical "1" or "0" inputs for a second selected period of time following said first selected period of time.

23. A method of processing and reading single data signals indicating values of a plurality of parameters, comprising:

(a) encoding each one of said single data signals with a first variable uniquely indicating the full-scale range of said value, encoding each of said single data signals with a second variable uniquely indicating the parameter represented by said first variable, and encoding each of said single data signals with a third variable the magnitude of which said third variable indicates the magnitude of said value of said parameter;

(b) sequentially selecting one of said encoded single data signals;

(c) using a digital multimeter to read said second variable indicating said parameter;

(d) using said digital multimeter to read said first variable indicating said full-scale range; and (e) using said digital multimeter to read said third variable indicating the magnitude of said value of said parameter.

24. A method, as defined in claim 23, wherein said variables are two or more variables selected from the group consisting of frequency, peak voltage, and duty cycle.

25. A method, as defined in claim 24, further comprising means to encode said single data signal with a variable indicating an alarm level.

26. A method of processing and reading single data signals indicating values of a plurality of parameters, comprising:

(a) encoding each one of said signal data signals with a first variable uniquely indicating the full-scale range of said value, encoding each one of said single data signals with a second variable the magnitude of which said second variable indicates the magnitude of said value;

(b) providing for each parameter an identifying third variable indicating the identity of said parameter;

(c) sequentially selecting one of said encoded single data signals;

(d) using a digital multimeter to read said third variable indicating the identity of said parameter;

(e) using said digital multimeter to read said first variable to indicate the full-scale range of said value; and (f) using said digital multimeter to read said second variable to indicate the magnitude of said value.

27. A method, as defined in claim 26, wherein said variables are two or more variables selected from the group consisting of frequency, peak voltage, and duty cycle.

28. A method, as defined in claim 27, further comprising means to encode said single data signal with a variable indicating an alarm level.

* * * * *

UNITED STATES PATENT AND TRADEMARK OFFICE
CERTIFICATE OF CORRECTION

PATENT NO. : 5,202,682

DATED : April 13, 1993

INVENTOR(S) : Eugene P. Finger

It is certified that error appears in the above-identified patent and that said Letters Patent is hereby corrected as shown below:

Column 14, line 4, "rest" should read --reset--.

Signed and Sealed this

Seventh Day of December, 1993

Attest:

BRUCE LEHMAN

*Attesting Officer*     *Commissioner of Patents and Trademarks*